United States Patent
Chan et al.

(10) Patent No.: US 9,754,898 B2
(45) Date of Patent: Sep. 5, 2017

(54) SEMICONDUCTOR PACKAGE AND FABRICATION METHOD THEREOF

(71) Applicant: Siliconware Precision Industries Co., Ltd., Taichung, Hsien (TW)

(72) Inventors: Mu-Hsuan Chan, Taichung Hsien (TW); Wan-Ting Chen, Taichung Hsien (TW); Chun-Tang Lin, Taichung Hsien (TW); Yi-Che Lai, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/922,828

(22) Filed: Jun. 20, 2013

(65) Prior Publication Data

US 2014/0084484 A1    Mar. 27, 2014

(30) Foreign Application Priority Data

Sep. 26, 2012  (TW) .............................. 101135243 A

(51) Int. Cl.
| | |
|---|---|
| *H01L 21/00* | (2006.01) |
| *H01L 23/00* | (2006.01) |
| *H01L 23/31* | (2006.01) |
| *H01L 21/56* | (2006.01) |

(52) U.S. Cl.
CPC .......... *H01L 23/562* (2013.01); *H01L 21/563* (2013.01); *H01L 21/565* (2013.01); *H01L 23/3114* (2013.01); *H01L 24/97* (2013.01); *H01L 2224/16225* (2013.01); *H01L 2924/351* (2013.01)

(58) Field of Classification Search
CPC .............................. H01L 21/78; H01L 23/485
See application file for complete search history.

(56) References Cited

U.S. PATENT DOCUMENTS

| | | | |
|---|---|---|---|
| 2010/0123217 A1* | 5/2010 | Poeppel et al. ................ | 257/536 |
| 2011/0175213 A1* | 7/2011 | Mori et al. ..................... | 257/675 |
| 2011/0241215 A1* | 10/2011 | Sankman et al. ............. | 257/773 |
| 2011/0291288 A1* | 12/2011 | Wu ................... | H01L 23/49827 |
| | | | 257/774 |
| 2012/0001339 A1* | 1/2012 | Malatkar ....................... | 257/773 |

* cited by examiner

*Primary Examiner* — William Harriston
(74) *Attorney, Agent, or Firm* — Mintz Levin Cohn Ferris Glovsky and Popeo, P.C.; Peter F. Corless; Steven M. Jensen

(57) ABSTRACT

A semiconductor package is provided, which includes: a carrier; at least an interposer disposed on the carrier; an encapsulant formed on the carrier for encapsulating the interposer while exposing a top surface of the interposer; a redistribution layer formed on the encapsulant and the top surface of the interposer; and at least a semiconductor element disposed on the redistribution layer. The top surface of the interposer is flush with a surface of the encapsulant so as for the redistribution layer to have a planar surface for disposing the semiconductor element, thereby preventing warpage of the interposer and improving the reliability of electrical connection between the redistribution layer and the semiconductor element.

18 Claims, 3 Drawing Sheets

SEMICONDUCTOR PACKAGE AND FABRICATION METHOD THEREOF

CROSS-REFERENCES TO RELATED APPLICATIONS

This application claims under 35 U.S.C. §119(a) the benefit of Taiwanese Application No. 101135243, filed Sep. 26, 2012, the entire contents of which is incorporated herein by reference.

BACKGROUND OF THE INVENTION

1. Field of the Invention

The present invention relates to semiconductor packages and fabrication methods thereof, and more particularly, to a semiconductor package having an interposer and a fabrication method thereof.

2. Description of Related Art

Flip-chip technologies facilitate to reduce chip packaging sizes and shorten signal transmission paths and therefore have been widely used for chip packaging. Various types of packages such as chip scale packages (CSPs), direct chip attached (DCA) packages and multi-chip module (MCM) packages can be achieved through flip-chip technologies.

In a flip-chip packaging process, a big CTE (Coefficient of Thermal Expansion) mismatch between a chip and a packaging substrate adversely affects the formation of joints between conductive bumps of the chip and contacts of the packaging substrate, thus easily resulting in delamination of the conductive bumps from the packaging substrate. On the other hand, along with increased integration of integrated circuits, a CTE mismatch between a chip and a packaging substrate induces more thermal stresses and leads to more serious warpage, thereby reducing the product reliability and resulting in failure of a reliability test.

Accordingly, semiconductor interposers have been developed to overcome the above-described drawbacks. FIG. 1 shows a semiconductor package 1 with a silicon interposer 11 provided between a packaging substrate 10 and a semiconductor chip 15. Since the interposer 11 and the semiconductor chip 15 are made of similar materials, the problem of CTE mismatch is overcome.

To form the semiconductor package 1, a wafer is provided with a plurality of TSVs 110 formed therein. A redistribution layer 111 is formed on one side of the wafer and a plurality of conductive bumps 12 are formed on the opposite side of the wafer. Subsequently, the wafer is singulated into a plurality of silicon interposers 11. Each of the silicon interposers 11 is disposed on a packaging substrate 10 through the conductive bumps 12 and an underfill 14 is filled between the silicon interposer 11 and the packaging substrate 10 for encapsulating the conductive bumps 12. Thereafter, a semiconductor chip 15 is disposed on and electrically connected to the redistribution layer 111 through a plurality of solder bumps 150 and an underfill 16 is filled between the silicon interposer 11 and the semiconductor chip 15 for encapsulating the solder bumps 150. Finally, a plurality of solder balls 13 are formed on a bottom side of the packaging substrate 10 for disposing a circuit board.

In the above-described semiconductor package 1, the silicon interposer 11 has a small thickness. When a reflow process is performed to the conductive bumps 12 or the solder bumps 150 so as for the silicon interposer 11 to bond with the packaging substrate 10 or the semiconductor chip 15, warpage can easily occur to the silicon interposer 11, thereby reducing the planarity of the surface of the silicon interposer 11. As such, when the semiconductor chip 15 is disposed on the interposer 11, cracking can easily occur to the solder bumps 150 or the conductive bumps 12, thus reducing the electrical connection reliability.

Further, two underfilling processes need to be performed for each of the silicon interposers 11 so as to form an underfill between the silicon interposer 11 and the packaging substrate 10 and form an underfill between the silicon interposer 11 and the semiconductor chip 15. Therefore, the process time is significantly increased, which does not facilitate mass production.

Furthermore, if the silicon interposer 11 has a small thickness such as 4 mil, when the underfill 14 is formed between the interposer 11 and the packaging substrate 10, the underfill 14 can easily creep up to contaminate the redistribution layer 111, thereby easily resulting in an electrical connection failure between the redistribution layer 111 and the semiconductor chip 15.

Therefore, there is a need to provide a semiconductor package and a fabrication method thereof so as to overcome the above-described drawbacks.

SUMMARY OF THE INVENTION

In view of the above-described drawbacks, the present invention provides a semiconductor package, which comprises: a carrier; at least an interposer having opposite first and second surfaces and disposed on the carrier through the first surface thereof; an encapsulant formed on the carrier for encapsulating the interposer, wherein the second surface of the interposer is exposed from the encapsulant; a redistribution layer formed on the second surface of the interposer and the encapsulant and electrically connected to the interposer; and at least a semiconductor element disposed on and electrically connected to the redistribution layer.

The present invention further provides a fabrication method of a semiconductor package, which comprises the steps of: disposing a plurality of interposers on a carrier, wherein each of the interposers has opposite first and second surfaces and is disposed on the carrier through the first surface thereof; forming an encapsulant on the carrier to encapsulate the interposers, wherein the second surfaces of the interposers are exposed from the encapsulant; forming a redistribution layer on the encapsulant and the second surfaces of the interposers, wherein the redistribution layer is electrically connected to the interposers; disposing and electrically connecting at least a semiconductor element to the redistribution layer; and performing a singulation process to form a plurality of semiconductor packages.

In the above-described package and method, the carrier can be a circuit board or a packaging substrate.

In the above-described package and method, the interposer can be a substrate body made of a silicon-containing material.

In the above-described package and method, the interposer can have a plurality of conductive through holes penetrating the first and second surfaces thereof and electrically connected to the redistribution layer. The first surface of the interposer can have at least a circuit layer formed thereon for electrically connecting the conductive through holes and the carrier.

In the above-described package and method, the second surface of the interposer can be flush with a surface of the encapsulant.

In the above-described package and method, the encapsulant can be flush with the carrier at sides.

In the above-described package and method, the number of the semiconductor element can be more than one, and the semiconductor elements can be electrically connected to one another through the redistribution layer.

In the above-described package and method, an adhesive can be formed between the redistribution layer and the semiconductor element.

Therefore, by disposing a plurality of interposers on a carrier and forming an encapsulant on the carrier to encapsulate the interposers, the present invention prevents warpage of the interposers and provides a planar surface for disposing semiconductor elements. Further, by performing a molding process instead of the conventional underfilling process, the present invention overcomes the conventional drawback of creeping of an underfill. Therefore, the prevent invention prevents cracking of conductive bumps between the redistribution layer and the semiconductor elements and improves the electrical connection reliability.

Furthermore, the encapsulant protects the interposers from external environment so as to avoid cracking.

Moreover, through only one molding process, the encapsulant can be formed to fix all the interposers, thereby eliminating the need of the conventional underfilling process for each of the interposers and greatly shortening the process time.

In addition, compared with the conventional redistribution layer that is only formed on the interposers, the redistribution layer of the present invention is formed not only on the interposers but also on the encapsulant, thereby providing a larger area and more contacts for disposing semiconductor elements. As such, the number of the semiconductor elements is not limited by the size of the interposers.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "first", "second", "a" etc. are merely for illustrative purpose and should not be construed to limit the scope of the present invention.

FIGS. 2A to 2G are schematic upper and cross-sectional views showing a semiconductor package and a fabrication method thereof according to the present invention.

Figure 1:
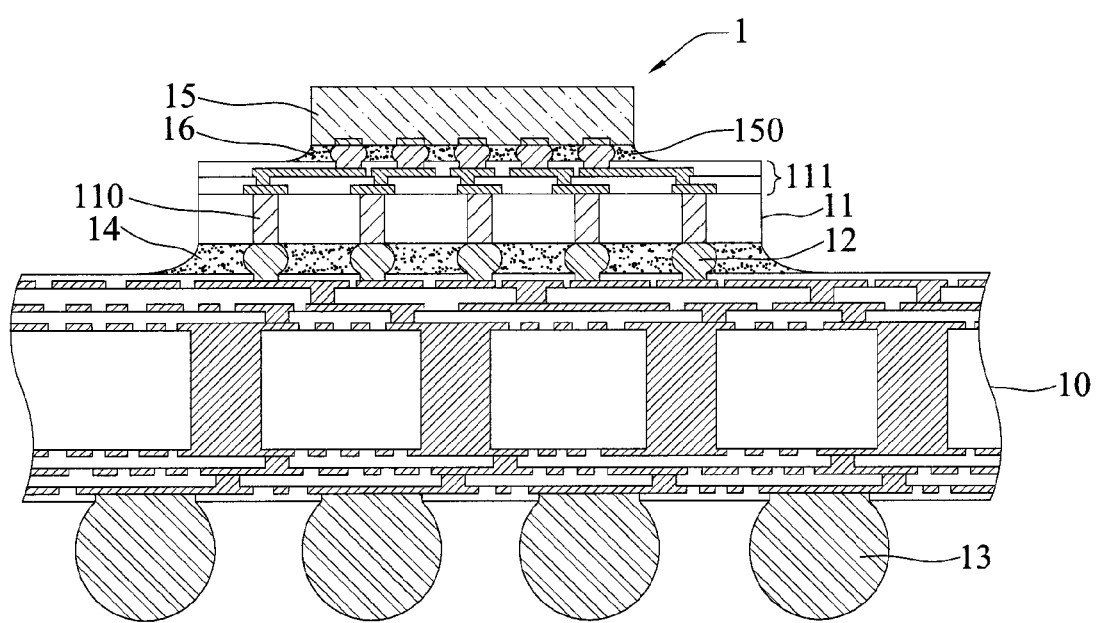
FIG. 1 is a schematic cross-sectional view showing a conventional semiconductor package.
Figure 2A:
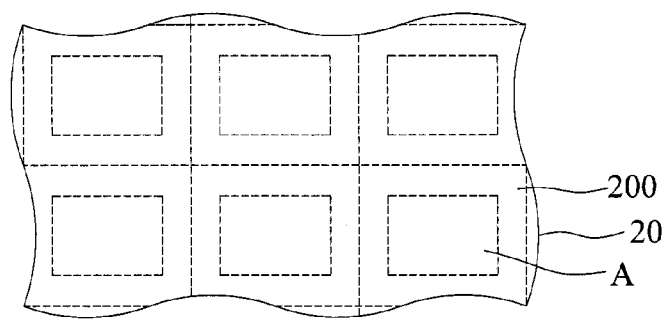
FIGS. 2A to 2G are schematic upper and cross-sectional views showing a semiconductor package and a fabrication method thereof according to the present invention, wherein FIG. 2B' is a partially enlarged view of FIG. 2B.

Referring to FIG. 2A, a carrier 20 having a plurality of packaging substrates 200 is provided. Each of the packaging substrates 200 has an attach area A. It should be noted that the packaging substrates 200 can have various structures without any special limitation.

Figure 2B:
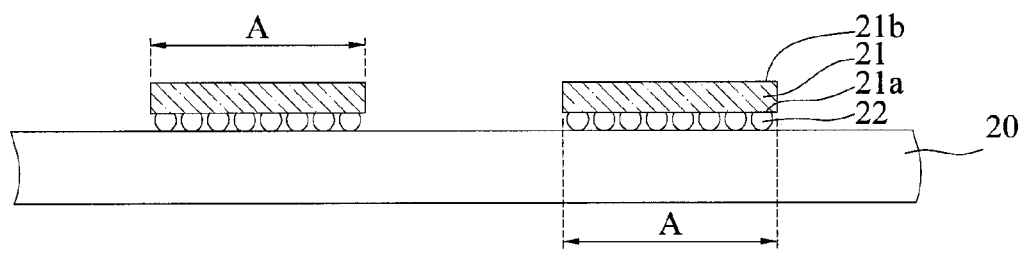
Figure 2B:
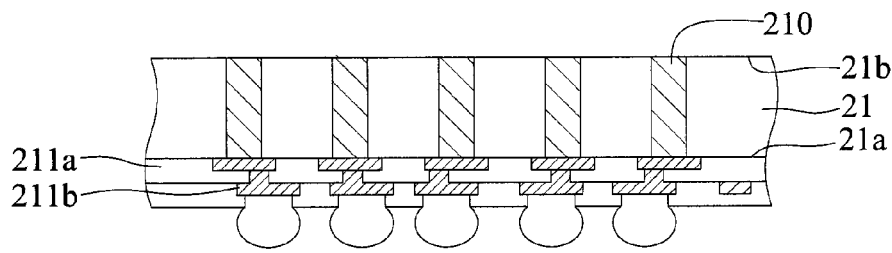

Referring to FIG. 2B, a plurality of interposers 21 are respectively disposed on the attach areas A and electrically connected to the packaging substrates 200 through a plurality of conductive bumps 22. Each of the interposers 21 has a first surface 21a and a second surface 21b opposite to the first surface 21a, and the interposer 21 is disposed on the carrier 20 through the first surface 21a thereof.

In the present embodiment, referring to FIG. 2B', a plurality of conductive through holes 210 are formed in the interposer 21 and penetrating the first and second surfaces 21a, 21b of the interposer 21. In particular, the first surface 21a of the interposer 21 has at least a dielectric layer 211a and a plurality of circuit layers 211b formed on the dielectric layer 211a, and the conductive through holes 210 are electrically connected to the packaging substrate 200 through the circuit layers 211b.

Further, the conductive bumps 22 are formed on the outermost circuit layer 211b for electrically connecting the circuit layer 211b and the packaging substrate 200.

The interposer 21 can be a substrate body made of a silicon-containing material, such as a semiconductor chip, a wafer or glass.

Figure 2C:
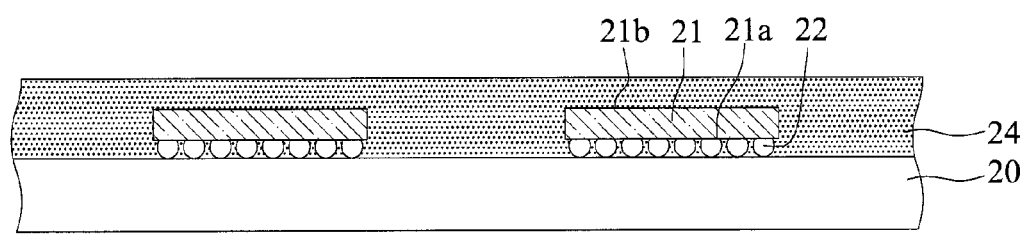

Referring to FIG. 2C, by performing a molding process, an encapsulant 24 is formed on the carrier 20 for encapsulating the interposers 21 and the conductive bumps 22.

Figure 2D:
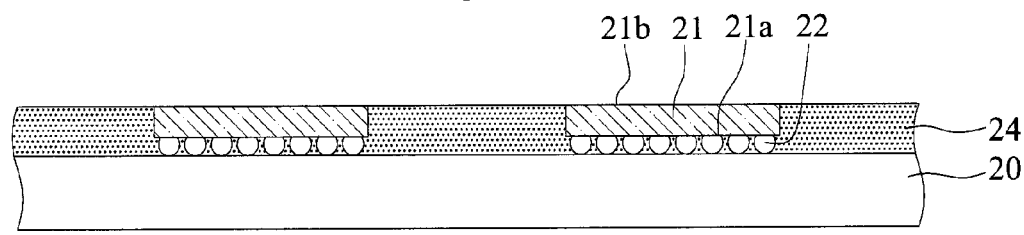

Referring to FIG. 2D, a portion of the encapsulant 24 is removed to expose the second surfaces 21b of the interposers 21.

In the present embodiment, the encapsulant 24 is partially removed by grinding so as to expose one ends of the conductive through holes 210. The second surfaces 21b of the interposers 21 are flush with a surface of the encapsulant 24 so as to form a planar attach surface. In other embodiments, the encapsulant 24 can be removed by cutting or etching.

By performing a molding process to form the encapsulant 24 instead of performing an underfilling process, the present invention prevents creeping of an underfill as in the prior alt.

Figure 2E:
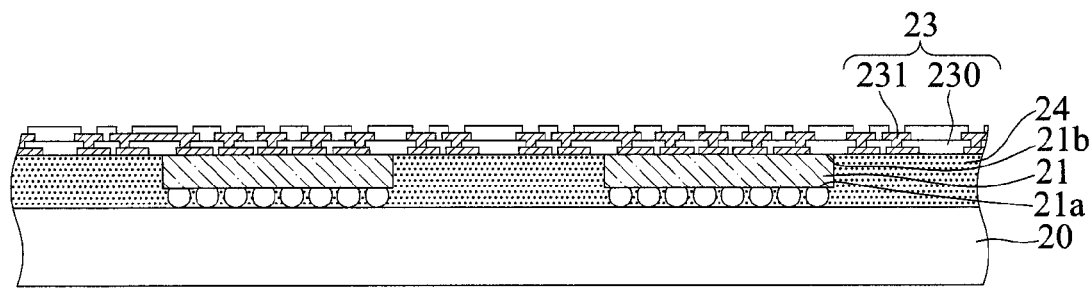

Referring to FIG. 2E, a redistribution layer 23 is formed on the surface of the encapsulant 24 and the second surfaces of the interposers 21 and electrically connected to the conductive through holes 210 of the interposers 21.

In the present embodiment, the redistribution layer 23 has at least a dielectric layer 230 and a plurality of circuit layers 231 stacked on one another.

Figure 2F:
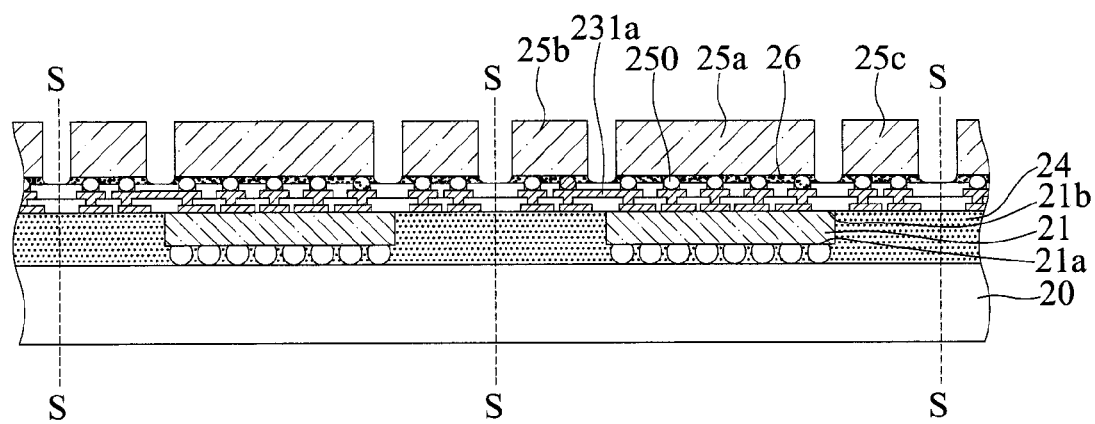

Referring to FIG. 2F, a plurality of semiconductor elements 25a, 25b, 25c are disposed on the redistribution layer 23 in a flip-chip manner and electrically connected to the redistribution layer 23 through a plurality of conductive bumps 250. In another embodiment, the semiconductor elements 25a, 25b, 25c can be disposed on the redistribution layer 23 through their inactive surfaces and electrically connected to the redistribution layer 23 through bonding wires.

Then, an adhesive 26 serving as an underfill is formed between the semiconductor elements 25a, 25b, 25c and the redistribution layer 23 so as to encapsulate the conductive bumps 250. If the semiconductor elements 25a, 25b, 25c are disposed on the redistribution layer 23 through the inactive surfaces thereof, the adhesive 26 can be formed between the inactive surfaces of the semiconductor elements 25a, 25b, 25c and the redistribution layer 23 so as to bond the semiconductor elements 25a, 25b, 25c to the redistribution layer 23.

In the present embodiment, three semiconductor elements 25a, 25b, 25c are provided for a single packaging substrate 200, and electrically connected to one another through the redistribution layer 23, i.e., through circuits 231a of the circuit layers 231. In another embodiment, only one semiconductor element is provided for a single packaging substrate 200.

Figure 2G:
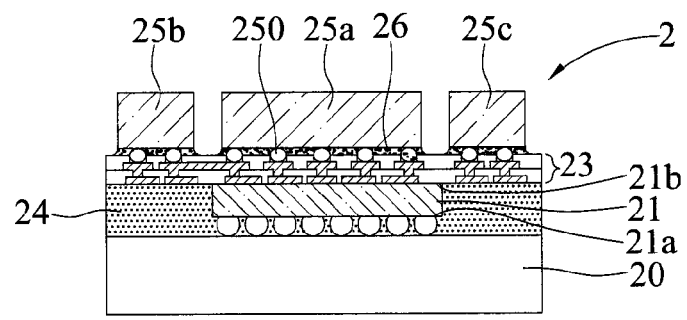

Referring to FIG. 2G a singulation process is performed along cutting lines S of FIG. 2F so as to form a plurality of semiconductor packages 2. The encapsulant 24 and the carrier 20 are flush with one another at sides.

Therefore, by forming the encapsulant 24 to encapsulate the interposers 21, the present invention prevents warpage of the interposers 21. Further, the encapsulant 24 protects the interposers 21 from external environment so as to avoid cracking.

Furthermore, the second surfaces 21b of the interposers 21 are flush with the surface of the encapsulant 24 so as for the redistribution layer 23 to have a planar surface for disposing the semiconductor elements 25a, 25b, 25c, thereby preventing cracking of the conductive bumps 250 and improving the electrical connection reliability.

Moreover, through only one molding process, the encapsulant 24 is formed to fix all the interposers 21 on the carrier 20, thus eliminating the need to repeat the underfilling processes for each of the interposers as in the prior art and hence greatly shortening the fabrication time.

In addition, since the redistribution layer 23 is formed not only on the second surfaces 21b of the interposers 21 but also on the surface of the encapsulant 24, each of the packaging substrates 200 has a larger area for disposing the semiconductor elements 25a, 25b, 25c compared with the prior art. Therefore, the number and position of the semiconductor elements 25a, 25b, 25c can be flexibly chosen.

The present invention further provides a semiconductor package 2, which has: a carrier 20; an interposer 21 disposed on the carrier 20; an encapsulant 24 formed on the carrier 20 for encapsulating the interposer 21; a redistribution layer 23 formed on the encapsulant 24 and the interposer 21; a plurality of semiconductor elements 25a, 25b, 25c disposed on the redistribution layer 23; and an adhesive 26 formed between the semiconductor elements 25a, 25b, 25c and the redistribution layer 23.

The carrier 20 is a circuit board or a packaging substrate 200.

The interposer 21 has a first surface 21a and a second surface 21b opposite to the first surface 21a and is disposed on the carrier 20 through the first surface 21a. Further, the interposer 21 has a plurality of conductive through holes 210 penetrating the first surface 21a and the second surface 21b and electrically connected to the carrier 20. The interposer 21 further has a circuit layer 211b formed on the first surface 21b thereof for electrically connecting the conductive through holes 210 and the carrier 20.

The interposer 21 is encapsulated by the encapsulant 24 and the conductive through holes 210 are exposed from the encapsulant 24. The encapsulant 24 and the carrier 20 are flush with one another at sides. In another embodiment, the second surface 21b of the interposer 21 is flush with a surface of the encapsulant 24.

The redistribution layer 23 is formed on the encapsulant 24 and the second surface 21b of the interposer 21 and electrically connected to the conductive through holes 210.

The semiconductor elements 25a, 25b, 25c are disposed on and electrically connected to the redistribution layer 23. In the present embodiment, the semiconductor elements 25a, 25b, 25c are electrically connected to one another through the redistribution layer 23.

The adhesive 26 is formed between the semiconductor elements 25a, 25b, 25c and the redistribution layer 23.

According to the present invention, an encapsulant is formed on a carrier to encapsulate interposers so as to prevent warpage of the interposers and provide a planar surface for disposing semiconductor elements, thereby preventing cracking of conductive bumps between the interposers and the semiconductor elements and improving the electrical connection reliability.

Further, through only one molding process, an encapsulant can be formed to fix all the interposers, thereby greatly shortening the process time.

Furthermore, by eliminating the need to perform the conventional underfilling process on the first surfaces of the interposers, the present invention overcomes the conventional drawback of creeping of an underfill.

In addition, since the redistribution layer is formed not only on the second surfaces of the interposers but also on the surface of the encapsulant, each of the packaging substrates has an increased area so as for more semiconductor elements to be disposed thereon.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
a carrier;
at least an interposer having opposite first and second surfaces and having a plurality of conductive through holes penetrating the first and second surfaces of the interposer, wherein the interposer is disposed on the carrier through the first surface of the interposer with a plurality of conductive bumps;
an encapsulant formed on the carrier and being flush with the carrier at sides for encapsulating the interposer, wherein the second surface of the interposer and ends of the conductive through holes are exposed from the encapsulant;
a redistribution layer formed on the second surface of the interposer and a surface of the encapsulant defined as a same side as the second surface, wherein the redistribution layer is in direct contact with the ends of the conductive through holes and electrically connected to the conductive through holes of the interposer; and
at least a semiconductor element disposed on and electrically connected to the redistribution layer.

2. The package of claim 1, wherein the carrier is a circuit board or a packaging substrate.

3. The package of claim 1, wherein the interposer is a substrate body made of a silicon-containing material.

4. The package of claim 1, wherein the conductive through holes are further electrically connected to the carrier.

5. The package of claim 4, further comprising at least a circuit layer formed on the first surface of the interposer for electrically connecting the conductive through holes and the carrier.

6. The package of claim 1, wherein the second surface of the interposer is flush with the surface of the encapsulant.

7. The package of claim 1, wherein the number of the semiconductor element is more than one, and the semiconductor elements are electrically connected to one another through the redistribution layer.

8. The package of claim 1, further comprising an adhesive formed between the redistribution layer and the semiconductor element.

9. A fabrication method of a semiconductor package, comprising the steps of:

disposing a plurality of interposers on a carrier through a plurality of conductive bumps, wherein each of the interposers has opposite first and second surfaces and a plurality of conductive through holes penetrating the first and second surfaces of the interposer, and each of the interposers is disposed on the carrier through the first surface of the interposer with the plurality of conductive bumps;

forming an encapsulant on the carrier and being flush with the carrier at sides to encapsulate the interposers, wherein the second surfaces of the interposers and ends of the conductive through holes are exposed from the encapsulant;

forming a redistribution layer on a surface of the encapsulant defined as a same side as the second surfaces and the second surfaces of the interposers, wherein the redistribution layer is in direct contact with the ends of the conductive through holes and electrically connected to the plurality of conductive through holes of each of the interposers;

disposing and electrically connecting at least a semiconductor element to the redistribution layer; and performing a singulation process to form a plurality of semiconductor packages.

10. The method of claim 9, wherein the carrier is a circuit board or a packaging substrate.

11. The method of claim 9, wherein the interposers are substrate bodies made of a silicon-containing material.

12. The method of claim 9, wherein the conductive through holes are further electrically connected to the carrier.

13. The method of claim 12, wherein the first surface of the interposer has at least a circuit layer formed thereon for electrically connecting the conductive through holes and the carrier.

14. The method of claim 9, wherein the second surfaces of the interposers are flush with the surface of the encapsulant.

15. The method of claim 9, wherein the number of the semiconductor element is more than one, and the semiconductor elements are electrically connected to one another through the redistribution layer.

16. The method of claim 9, further comprising forming an adhesive between the redistribution layer and the semiconductor element.

17. The package of claim 1, wherein the encapsulant is further formed between the interposer and the carrier.

18. The method of claim 9, wherein the encapsulant is further formed between the interposer and the carrier.

* * * * *